US006284425B1

(12) United States Patent
Staral et al.

(10) Patent No.: US 6,284,425 B1
(45) Date of Patent: Sep. 4, 2001

(54) THERMAL TRANSFER DONOR ELEMENT HAVING A HEAT MANAGEMENT UNDERLAYER

(75) Inventors: John S. Staral; Thomas R. Hoffend, Jr., both of Woodbury, MN (US)

(73) Assignee: 3M Innovative Properties, St. Paul, MN (US)

( * ) Notice: Subject to any disclaimer, the term of this patent is extended or adjusted under 35 U.S.C. 154(b) by 0 days.

(21) Appl. No.: 09/473,114

(22) Filed: Dec. 28, 1999

(51) Int. Cl.[7] .................... G03F 7/34; G03C 1/91; G03C 1/93

(52) U.S. Cl. .................... 430/201; 430/200; 430/271.1

(58) Field of Search .................... 430/200, 201, 430/271.1

(56) References Cited

U.S. PATENT DOCUMENTS

| | | | | |
|---|---|---|---|---|
| 4,252,671 | | 2/1981 | Smith . | |
| 4,465,767 | * | 8/1984 | Oba et al. | 430/271.1 |
| 5,156,938 | | 10/1992 | Foley et al. . | |
| 5,166,024 | | 11/1992 | Bugner et al. . | |
| 5,171,650 | | 12/1992 | Ellis et al. | 430/201 |
| 5,244,770 | | 9/1993 | DeBoer et al. | 430/200 |
| 5,256,506 | | 10/1993 | Ellis et al. | 430/200 |
| 5,351,617 | | 10/1994 | Williams et al. | 101/467 |
| 5,387,496 | | 2/1995 | DeBoer . | |
| 5,501,937 | | 3/1996 | Matsumoto et al. | 430/200 |
| 5,501,938 | | 3/1996 | Ellis et al. | 430/200 |
| 5,521,035 | | 5/1996 | Wolk et al. | 430/200 |
| 5,534,383 | * | 7/1996 | Takahashi et al. | 430/200 |
| 5,593,808 | | 1/1997 | Ellis | 430/253 |
| 5,605,780 | | 2/1997 | Burberry et al. | 430/278.1 |
| 5,612,165 | | 3/1997 | Ellis | 430/201 |
| 5,622,795 | | 4/1997 | Ellis | 430/201 |
| 5,631,117 | * | 5/1997 | Nakajima et al. | 430/200 |
| 5,685,939 | | 11/1997 | Wolk et al. . | |
| 5,691,098 | | 11/1997 | Busman et al. . | |
| 5,691,114 | | 11/1997 | Burberry et al. . | |
| 5,693,446 | | 12/1997 | Staral et al. . | |
| 5,710,097 | | 1/1998 | Staral et al. . | |
| 5,725,989 | | 3/1998 | Chang et al. | 430/200 |
| 5,828,488 | | 10/1998 | Ouderkirk et al. . | |
| 5,882,774 | | 3/1999 | Jonza et al. . | |
| 5,994,028 | | 11/1999 | Lee | 430/200 |
| 6,010,817 | * | 1/2000 | Van Damme et al. | 430/200 |
| 6,083,649 | * | 7/2000 | Takeshita et al. | 430/200 |
| 6,114,088 | * | 9/2000 | Wolk et al. | 430/200 |

FOREIGN PATENT DOCUMENTS

| | | |
|---|---|---|
| 11-11032 | 1/1999 | (JP) . |
| WO 95/17303 | 6/1995 | (WO) . |
| WO 97/15173 | 4/1997 | (WO) . |
| WO 98/03346 | 1/1998 | (WO) . |
| WO 99/46961 | 9/1999 | (WO) . |

* cited by examiner

*Primary Examiner*—Richard L. Schilling
(74) *Attorney, Agent, or Firm*—Robert J. Pechman

(57) ABSTRACT

A thermal transfer donor element is disclosed that includes a substrate, a transfer layer, a light-to-heat conversion layer disposed between the substrate and the transfer layer, and an underlayer disposed between the substrate and the light-to-heat conversion layer. The underlayer manages heat flow between layers of the donor element during imaging. For example, the underlayer can increase heat transport from the light-to-heat conversion layer to the substrate to prevent overheating. The underlayer can also be used to insulate the substrate from heat generated in the light-to-heat conversion layer or to increase heat flow to the transfer layer during imaging. Managing heat flow using an underlayer can improve transfer properties and/or reduce defect formation during imaging.

16 Claims, 1 Drawing Sheet

THERMAL TRANSFER DONOR ELEMENT HAVING A HEAT MANAGEMENT UNDERLAYER

This invention relates to thermal mass transfer donor elements for transferring materials to a receptor.

BACKGROUND

The thermal transfer of layers from a thermal transfer element to a receptor has been suggested for the preparation of a variety of products. Such products include, for example, color filters, spacers, black matrix layers, polarizers, printed circuit boards, displays (for example, liquid crystal displays and emissive displays), polarizers, z-axis conductors, and other items that can be formed by thermal transfer including, for example, those described in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097; and International Publication Nos. WO 98/03346 and WO 97/15173; all of which are incorporated herein by reference.

For many of these products, resolution and edge sharpness can be important factors in the manufacture of the product. Another factor can be the size of the transferred portion of the thermal transfer element for a given amount of thermal energy. As an example, when lines or other shapes are transferred, the linewidth or diameter of the shape depends on the size of the resistive element or light beam used to pattern the thermal transfer element. The linewidth or diameter also depends on the ability of the thermal transfer element to transfer energy. Near the edges of the resistive element or light beam, the energy provided to the thermal transfer element may be reduced. Thermal transfer elements with better thermal conduction, less thermal loss, more sensitive transfer coatings, and/or better light-to-heat conversion typically produce larger linewidths or diameters. Thus, the linewidth or diameter can be a reflection of the efficiency of the thermal transfer element in performing the thermal transfer function.

SUMMARY OF THE INVENTION

One manner in which thermal transfer properties can be improved is by improvements in the formulation of the transfer layer material. For example, co-assigned U.S. patent application Ser. No. 09/392,386 discloses including a plasticizer in the transfer layer to improve transfer properties. Other ways to improve transfer fidelity during laser induced thermal transfer include increasing the laser power and/or fluence incident on the donor media. However, increased laser power or fluence can lead to imaging defects, presumably caused in part by overheating of one or more layers in the donor media.

The present invention recognizes that an underlayer can be included in a thermal transfer donor element between the donor substrate and the light-to-heat conversion layer, and that this underlayer can be used to control heat flow and/or manage thermal profiles in the donor element and/or reduce imaging defects during imaging.

In one embodiment, the present invention provides a thermal transfer donor element that includes a substrate, a transfer layer, a light-to-heat conversion layer disposed between the transfer layer and the substrate, and an underlayer disposed between the substrate and the light-to-heat conversion layer, where the underlayer is included to manage heat flow between layers in the donor element (for example, between the light-to-heat conversion layer and the substrate, or between the light-to-heat conversion layer and transfer layer) and/or to reduce imaging defects during imaging.

In another embodiment, the present invention provides a method for patterning materials using a thermal transfer donor element that includes a substrate, a transfer layer, a light-to-heat conversion layer disposed between the transfer layer and the substrate, and an underlayer disposed between the substrate and the light-to-heat conversion layer.

BRIEF DESCRIPTION OF THE DRAWINGS

The invention may be more completely understood in consideration of the following detailed description of various embodiments of the invention in connection with the accompanying drawings, in which.

Figure 1A:
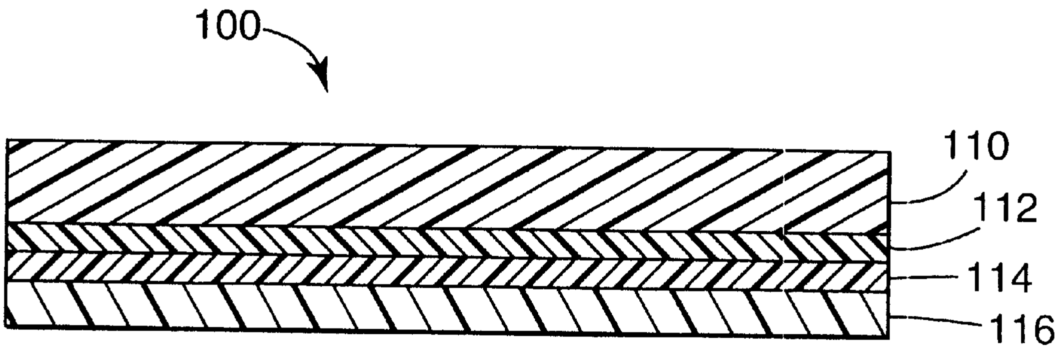
FIGS. 1(*a*) and (*b*) show schematic cross-sectional views of exemplary donor element constructions of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to thermal mass transfer of materials from a donor element to a receptor. In particular, the present invention is directed to thermal mass transfer donor elements and methods of thermal mass transfer using donor elements that include a substrate, a light-to-heat conversion layer (LTHC layer), a thermal transfer layer, and an underlayer disposed between the LTHC layer and the substrate. The underlayer can be provided in donor elements according to the present invention to manage or control heat flow in the donor elements during imaging, particularly heat flow between the LTHC layer and the substrate. For example, the underlayer can be provided to increase heat transport from the LTHC layer to the substrate, to increase heat transport toward the transfer layer, and the like.

An advantage to controlling heat flow and/or managing thermal profiles in the donor element can be the reduction in defects caused by thermal decomposition or overheating of the LTHC layer (or other layers). Such defects can include distortion of the transferred image (for example due to distortion or transparentization of the LTHC layer from excessive heat during imaging, mechanical distortion of one or layers, etc.), undesired transfer of portions of the LTHC layer to the receptor, unintended fragmentation of the transferred image, increased surface roughness of the transferred image (for example due to mechanical distortion of one or more layers due to overheating of the donor element during imaging), and the like. For convenience, such defects will be referred to collectively as imaging defects.

Using the donor constructions and methods of the present invention can make it possible to manage temperatures and temperature distributions attained during imaging of thermal mass transfer donor media, as well as to control heat transport between and within the layers of donor elements during imaging.

Figure 1B:
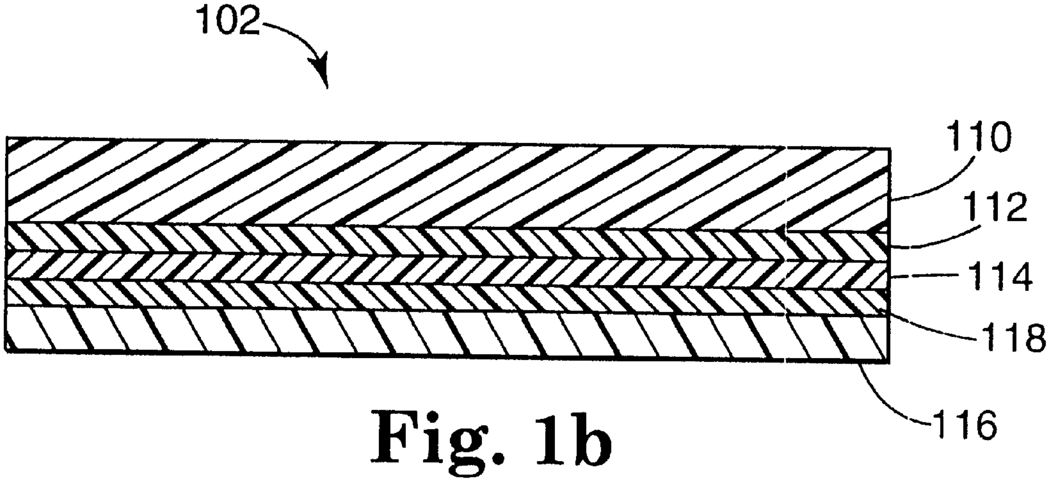

FIGS. 1(*a*) and (*b*) show examples of thermal mass transfer donor element constructions. Donor element 100 has a substrate 110, an underlayer 112, an LTHC layer 114, and a transfer layer 116. Donor element 102 shows a similar construction that additionally includes an interlayer 118 disposed between the LTHC layer 114 and the transfer layer 116.

Materials can be transferred from the transfer layer of a thermal mass transfer donor element (such as those shown in FIGS. 1(*a*) and (*b*)) to a receptor substrate by placing the transfer layer of the donor element adjacent to the receptor and irradiating the donor element with imaging radiation that can be absorbed by the LTHC layer and converted into heat. The donor can be exposed to imaging radiation through the donor substrate, or through the receptor, or both. The radiation can include one or more wavelengths, including visible light, infrared radiation, or ultraviolet radiation, for example from a laser, lamp, or other such radiation source. Material from the thermal transfer layer can be selectively transferred to a receptor in this manner to imagewise form patterns of the transferred material on the receptor. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

The mode of thermal mass transfer can vary depending on the type of irradiation, the type of materials and properties of the LTHC layer, the type of materials in the transfer layer, etc., and generally occurs via one or more mechanisms, one or more of which may be emphasized or de-emphasized during transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby the heat generated in an LTHC layer of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (≧100 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is required (e.g., for high information full color display applications) over large substrate areas, a laser is particularly useful as the radiation source. Laser sources are also compatible with both large rigid substrates (e.g., 1 m×1 m×1.1mm glass) and continuous or sheeted film substrates (e.g., 100 $\mu$m polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. A radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or the LTHC layer. The presence of the optional interlayer may eliminate or reduce the transfer of material from the LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

In some instances, it may be necessary, desirable, and/or convenient to sequentially use two or more different thermal transfer elements to form a device, such as an optical display. For example, a black matrix may be formed, followed by the thermal transfer of a color filter in the windows of the black matrix. As another example, a black matrix may be formed, followed by the thermal transfer of one or more layers of a thin film transistor. As another example, multiple layer devices can be formed by transferring separate layers or separate stacks of layers from different thermal transfer elements. Multilayer stacks can also be transferred as a single transfer unit from a single donor element. Examples of multilayer devices include transistors such as organic field effect transistors (OFETs), organic electroluminescent pixels and/or devices, including organic light emitting diodes (OLEDs). Multiple donor sheets can also be used to form separate components in the same layer on the receptor. For example, three different color donors can be used to form color filters for a color electronic display. Also, separate donor sheets, each having multiple layer transfer layers, can be used to pattern different multilayer devices (e.g., OLEDs that emit different colors, OLEDs and OFETs that connect to form addressable pixels, etc.). A variety of other combinations of two or more thermal transfer elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

Referring back to the donor constructions shown in FIGS. 1(*a*) and (*b*), various layers of thermal mass transfer donor elements of the present invention will now be described.

The donor substrate 110 can be a polymer film. One suitable type of polymer film is a polyester film, for example, polyethylene terephthalate or polyethylene naphthalate films. However, other films with sufficient optical properties, including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the LTHC layer. However, as described below, the inclusion of an underlayer between the substrate and the LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers. One example of a suitable substrate with primer layer is available from Teijin Ltd. (Product No. HPE100, Osaka, Japan).

An underlayer 112 may be coated or otherwise disposed between a donor substrate and the LTHC layer, for example to control heat flow between the substrate and the LTHC layer during imaging and/or to provide mechanical stability to the donor element for storage, handling, donor processing, and/or imaging.

The underlayer can include materials that impart desired mechanical and/or thermal properties to the donor element. For example, the underlayer can include materials that exhibit a low (specific heat×density) and/or low thermal conductivity relative to the donor substrate. Such an underlayer may be used to increase heat flow to the transfer layer, for example to improve the imaging sensitivity of the donor. In these cases it may be desirable for the underlayer to include materials that have thermal conductivities of about 0.4 W/(m-K) or less, more preferably about 0.3 W/(m-K) or less, most preferably about 0.2 W/(m-K) or less. Similarly, in these cases the ratio of the thermal conductivity of the underlayer to the thermal conductivity of the substrate is preferably less than 0.9, more preferably less than 0.7, and most preferably less than 0.5. Additionally, it may be desirable to form an underlayer that exhibits a (specific heat× density) of about 7 J/cc/K or less, more preferably about 5 J/cc/K or less, and even more preferably about 3 J/cc/K or less. Similarly, in these cases the ratio of the (specific heat×density) of the underlayer to the (specific heat×density) of the substrate is preferably less than 0.9, more preferably less than 0.7, and most preferably less than 0.5. In other instances, it may be desirable to manage a peak temperature achieved in the LTHC layer during imaging (for example, to increase the imaging window—that is, the range of imaging doses available where transfer occurs but imaging defects are reduced—and/or to decrease imaging defects attributable to LTHC layer (or other layers) overheating). In these cases, the underlayer may include materials that exhibit a high (specific heat×density) and/or high thermal conductivity relative to the donor substrate. In these instances, the underlayer may include materials that have a higher thermal conductivity (e.g., about 0.15 W/(m-K) or greater, more preferably about 0.2 W/(m-K) or greater, even more preferably about 0.3 W/(m-K) or greater). Similarly, in these cases the ratio of the thermal conductivity of the underlayer to the thermal conductivity of the substrate is preferably greater than 1.1, more preferably greater than 1.5, and most preferably greater than 2.0. Similarly, it may be desirable to form an underlayer that exhibits a (specific heat×density) of about 3 J/cc/K or greater, more preferably about 5 J/cc/K or greater, and even more preferably about 7 J/cc/K or greater. Similarly the ratio of the (specific heat×density) of the underlayer to the (specific heat×density) of the substrate is preferably greater than 1.1, more preferably greater than 1.5, and most preferably greater than 2.0.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation and/or reflection of imaging radiation by the underlayer may be used to control heat generation during imaging.

The underlayer may be comprised of materials that have thermal, mechanical, optical, and/or electrical properties that are isotropic or anisotropic to achieve an underlayer that has similar isotropic or anisotropic properties. Additionally, materials that exhibit isotropic or anisotropic properties may be oriented or non-uniformly dispersed throughout an underlayer to produce an underlayer that has anisotropic properties. As one example, metal thin film underlayers can be formed and oriented according to crystal growth direction and/or grain boundary formation.

Suitable underlayers can include organic materials, inorganic materials, or composites. When composites are used, continuous and/or discontinuous phases may be chosen to meet the desired functional characteristics of underlayer. For example, if a highly insulating underlayer is desired, the continuous and/or discontinuous phases of a composite underlayer may comprise materials of low thermal conductivity and/or low (specific heat×density). For example, an underlayer may comprise a low thermal conductivity and/or (specific heat×density) polymer continuous phase matrix dispersed with an inorganic filler that has an even lower thermal conductivity and/or (specific heat×density) discontinuous phase. Alternatively, if management of peak temperature achieved in the LTHC layer is an objective, the underlayer may comprise a high thermal conductivity and/or (specific heat×density) polymer continuous phase matrix dispersed with an inorganic filler that has an even higher thermal conductivity and/or (specific heat×density) discontinuous phase (e.g., silica, metal particles, etc.). As another example, particles (for example, $TiO_2$) dispersed in a polymeric matrix may be employed to produce an underlayer with reflective properties.

Thermal transfer donor elements can also have underlayers that include an open-cell or closed-cell foam comprising a gas. This may produce a highly insulative underlayer that can increase the peak temperature during imaging by inhibiting heat loss caused by heat flow to the substrate. Alternatively, the underlayer may comprise metals and/or metal oxides to increase the heat transfer away from the LTHC. The underlayer may also comprise non-metallic inorganic materials. Examples of these materials include metal oxides, diamond-like carbon ("DLC"), $SiO_2$, etc.

The underlayer can be comprised of any of a number of known polymers such as thermoset (crosslinked), thermosettable (crosslinkable), or thermoplastic polymers, including acrylates (including methacrylates, blends, mixtures, copolymers, terpolymers, tetrapolymers, oligomers, macromers, etc.), polyols (including polyvinyl alcohols), epoxy resins (also including copolymers, blends, mixtures, terpolymers, tetrapolymers, oligomers, macromers, etc.), silanes, siloxanes (with all types of variants thereof), polyvinyl pyrrolidinones, polyesters, polyimides, polyamides, poly (phenylene sulphide), polysulphones, phenol-formaldehyde resins, cellulose ethers and esters (for example, cellulose acetate, cellulose acetate butyrate, etc.), nitrocelluloses, polyurethane, polyesters (for example, poly (ethylene terephthalate), polycarbonates, polyolefin polymers (for example, polyethylene, polypropylene, polychloroprene, polyisobutylene, polytetrafluoroethylene, polychlorotrifluoroethylene, poly (p-chlorostyrene), polyvinylidene fluoride, polyvinylchloride, polystyrene, etc.) and copolymers (for example, polyisobutene-co-isoprene, etc.), polymerizable compositions comprising mixtures of these polymerizable active groups (e.g., epoxy-siloxanes, epoxy-silanes, acryloyl-silanes, acryloyl-siloxanes, acryloyl-epoxies, etc.), phenolic resins (e.g., novolak and resole resins), polyvinylacetates, polyvinylidene chlorides, polyacrylates, nitrocelluloses, polycarbonates, and mixtures thereof The underlayers may include homopolymers or copolymers (including, but not limited to random copolymers, graft copolymers, block copolymers, etc.).

Underlayers may be formed by any suitable means, including coating, laminating, extruding, vacuum or vapor depositing, electroplating, and the like. For example, crosslinked underlayers may be formed by coating an uncrosslinked material onto a donor substrate and crosslinking the coating. Alternatively a crosslinked underlayer may be initially formed and then laminated to the substrate subsequent to crosslinking. Crosslinking can take place by any means known in the art, including exposure to radiation and/or thermal energy and/or chemical curatives (water, oxygen, etc.).

The thickness of the underlayer is typically greater than that of conventional adhesion primers and release layer coatings, preferably greater than 0.1 microns, more preferably greater than 0.5 microns, most preferably greater than 1 micron. In some cases, particularly for inorganic or metallic underlayers, the underlayer can be much thinner. For example, thin metal underlayers that are at least partially reflective at the imaging wavelength might be useful in imaging systems where the donor elements are irradiated from the transfer layer side. In other cases, the underlayers can be much thicker than these ranges, for example when the underlayer is included to provide some mechanical support in the donor element.

Referring again to FIGS. 1(*a*) and (*b*), an LTHC layer 114 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in co-assigned U.S. patent application Ser. No. 09/474,002 (entitled "Thermal Mass Transfer Donor Elements"), the disclosure of which is wholly incorporated into this document, non-homogeneous LTHC layers can be used to control temperature profiles in donor elements. This can give rise to thermal transfer elements that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. For example, IR absorbers marketed by Glendale Protective Technologies, Inc., Lakeland, Fla., under the designation CYASORB IR-99, IR-126 and IR-165 may be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 $\mu$m to 20 $\mu$m, preferably, 0.5 $\mu$m to 10 $\mu$um, and, more preferably, 1 $\mu$m to 7 $\mu$m. An inorganic LTHC layer is coated, in at least some instances, to a thickness in the range of 0.0005 to 10 $\mu$m, and preferably, 0.001 to 1 $\mu$m.

Referring again to FIG. 1(*b*), an optional interlayer 118 may be disposed between the LTHC layer 114 and transfer layer 116, as shown for donor constructions 102. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the thermal transfer element to imaging radiation. For polymer interlayers, the thickness of the interlayer typically is in the range of 0.05 $\mu$m to 10 $\mu$m. For inorganic interlayers (e.g., metal or metal compound interlayers), the thickness of the interlayer typically is in the range of 0.005 $\mu$m to 10 $\mu$m.

Referring again to FIGS. 1(*a*) and (*b*), a thermal transfer layer 116 is included in thermal mass transfer donor elements of the present invention. Transfer layer 116 can include any suitable material or materials, disposed in one or more layers with or without a binder, that can be selectively transferred as a unit or in portions by any suitable transfer mechanism when the donor element is exposed to imaging radiation that can be absorbed by the LTHC layer and converted into heat.

Examples of transfer layers that can be selectively patterned from thermal mass transfer donor elements include colorants (e.g., pigments and/or dyes dispersed in a binder), polarizers, liquid crystal materials, particles (e.g., spacers for liquid crystal displays, magnetic particles, insulating particles, conductive particles), emissive materials (e.g., phosphors and/or organic electroluminescent materials), hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymers, adhesives, binders, enzymes and other bio-materials, and other suitable materials or combination of materials. These and other transfer layers are disclosed in the following documents: U.S. Pat. Nos. 5,725,989; 5,710,097; 5,693,446; 5,691,098; 5,685,939; and 5,521,035; International Publication Nos. WO 97/15173, WO 98/03346, and WO 99/46961; and co-assigned U.S. patent application Ser. Nos. 09/231,724; 09/312,504; 09/312,421; and 09/392,386.

Particularly well suited transfer layers include materials that are useful in display applications. Thermal mass transfer according to the present invention can be performed to pattern one or more materials on a receptor with high precision and accuracy using fewer processing steps than for photolithography-based patterning techniques, and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers, phosphor layers, organic electroluminescent devices, organic transistors, and other such elements, devices, or portions thereof that can be useful in displays, alone or in combination with other elements that may or may not be patterned in a like manner.

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of rigid receptor substrates include glass, indium tin oxide coated glass, low temperature polysilicon (LTPS), and rigid plastic. Suitable flexible substrates include substantially clear and transmissive polymer films, reflective films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 to 100 mils (i.e., 0.05 to 2.54 mm) is preferred.

For glass receptor substrates, a typical thickness is 0.2 to 2.0 mm. It is often desirable to use glass substrates that are 1.0 mm thick or less, or even 0.7 mm thick or less. Thinner substrates result in thinner and lighter weight displays. Certain processing, handling, and assembling conditions, however, may suggest that thicker substrates be used. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receptor substrate is a polymeric film, it may be preferred that the film be non-birefringent to substantially prevent interference with the operation of the display in which it is to be integrated, or it may be preferred that the film be birefringent to achieve desired optical effects. Exemplary non-birefringent receptor substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonex™ from Nippon Zeon Co., Ltd.). Exemplary birefringent polymeric receptors include multilayer polarizers or mirrors such as those disclosed in U.S. Pat. Nos. 5,882,774 and 5,828,488, and in International Publication No. WO 95/17303.

EXAMPLES

In the following Examples, thermal transfer donor elements were prepared having underlayers. In addition, comparative examples were prepared and evaluated for imaging performance properties relative to the underlayer-containing donor elements.

The materials employed below were obtained from Aldrich Chemical Co. (Milwaukee, Wis.) unless otherwise specified.

Laser transfer was accomplished using two single-mode Nd:YAG lasers. Scanning was performed using a system of linear galvanometers, with the combined laser beams focused onto the image plane using an f-theta scan lens as part of a near-telecentric configuration. The power on the image plane was approximately 16 W. The laser spot size, measured at the $1/e^2$ intensity, was 30 microns by 350 microns. The linear laser spot velocity was adjustable between 10 and 30 meters per second, measured at the image plane. The laser spot was dithered perpendicular to the major displacement direction with about a 100 $\mu$m amplitude. The transfer layers were transferred as lines onto a glass receptor substrate, and the intended width of the lines was about 90 $\mu$m. The glass receptor substrate was held in a recessed vacuum frame, the donor sheet was placed in contact with the receptor and was held in place via application of a vacuum.

Example 1

A 3.88 mil thick (about 100 microns) polyethylene terephthalate (PET) substrate was coated with a 2.5 micron coating of cellulose acetate butyrate to produce an underlayer on the substrate. An LTHC layer was then coated onto the underlayer. The composition of the LTHC layer after drying and solvent removal is provided in Table I.

TABLE 1

LTHC Layer Composition

| Component | Parts by Weight |
|---|---|
| Raven 760 Ultra (carbon black pigment, available from Columbian Chemicals Co., Atlanta, GA) | 12.92 |
| Butvar ™ B-98 (polyvinyl butyral resin, available from Solutia Inc., St. Louis, MO) | 2.31 |
| Joncryl ™ 67 (acrylic resin, available from S. C. Johnson & Son, Inc., Racine, WI) | 6.92 |
| Disperbyk ™ 161 (dispersant, available from Byk-Chemie USA, Wallingford, CT) | 1.16 |
| FC-430 (surfactant, available from 3M Co., St. Paul, MN) | 0.04 |
| Ebecryl 629 (epoxy novolac acrylate, available from UCB Radcure Inc., N. Augusta, SC) | 43.95 |
| Elvacite 2669 (acrylic resin, available from ICI Acrylics Inc., Memphis, TN) | 26.64 |
| Irgacure ™ 369 (2-benzyl-2-(dimethylamino)-1-(4-(morpholinyl)phenyl) butanone photoinitiator, available from Ciba-Geigy Corp., Tarrytown, NY) | 2.70 |
| Irgacure ™ 184 (1-hydroxycyclohexyl phenyl ketone photoinitiator, available from Ciba-Geigy Corp., Tarrytown, NY) | 0.44 |

The LTHC layer was UV-cured at 20 feet/minute using a Fusion Systems Model 1600 (600 watts/inch) UV curing system fitted with D-bulbs. The thickness of the cured coating was determined to be approximately 2.7 microns. The cured coating had an optical density of 1.16 at 1064 nm.

Next, an interlayer was coated onto the LTHC layer. The interlayer coating composition (after drying and solvent removal) used is given in Table 2.

TABLE 2

Interlayer Composition

| Component | Parts by Weight |
|---|---|
| SR 351 HP (trimethylolpropane triacrylate esters available from Sartomer, Exton, PA) | 76.79 |
| Butvar ™ B-98 | 4.76 |
| Joncryl ™ 67 | 14.29 |
| Duracure ™ 1173 (2-hydroxy-2 methyl-1-phenyl-1-propanone photoinitiator, available from Ciba-Geigy, Hawthorne, NY) | 4.76 |

The interlayer coating was UV-cured at 20 feet/minute using a Fusion Systems Model 1600 (600 watts/inch) UV-curing system fitted with D-bulbs. The thickness of the cured interlayer was determined to be approximately 1.0 microns.

A blue transfer layer was then rotogravure coated onto the interlayer. The composition used for the blue transfer layer (after drying and solvent removal) is given in Table 3.

TABLE 3

Blue Transfer Layer Composition

| Component | Parts by Weight |
|---|---|
| Heliogen Blue L6700F Pigment Blue 15:6, available from BASF Corp., Mount Olive, NJ) | 21.41 |
| HOSTAPERM Vioiet RL-NF Pigment Violet 23, available from Clariant Corp., Coventry, RI) | 0.93 |
| Disperbyk ™ 161 | 3.29 |
| G-Cryl ® 6005 (acrylic binder, available from Henkel Corp., Ambler, PA) | 46.49 |
| Epon SU-8 (Bisphenol A/novolac epoxy resin, Shell chemical Co., Houston, TX) | 27.89 |

The transfer layer was left uncured after coating. The thickness of the uncured blue transfer layer was determined to be approximately 1.2 microns. The resultant donor element included the following layers in order: a substrate, an underlayer, an LTHC layer, an interlayer, and a transfer layer.

Example 2 (Comparative)

A donor element was made according to Example 1, except that the underlayer material was not coated onto the PET substrate. The resultant donor element included, in order, a substrate, an LTHC layer, an interlayer, and a transfer layer. The thicknesses and compositions of the substrate, LTHC layer, interlayer, and transfer layer were the same as for the corresponding layers of the donor element prepared in Example 1.

Example 3

The donor elements made according to Example 1 and Comparative Example 2 were imaged as a function of dose onto separate 1.1 mm thick glass receptors. The transferred lines were then analyzed for line width and the presence of certain imaging defects. Specifically, the two types of imaging defects screened were LTHC transfer to the receptor and fragmentation of the transferred coating. These types of defects are typically attributed to overheating of the LTHC layer during imaging, and will be collectively referred to in these Examples as "blow-up" defects. The results of these analyses are provided in Table 4.

TABLE 4

Imaging Performance of Donor Elements Made According to Example 1 and Comparative Example 2

| | Average Line Width ($\mu$m) | | % of Lines Exhibiting LTHC "Blow-up" Defects | |
|---|---|---|---|---|
| Imaging Dose (joules/cm$^2$) | Example 1 | Comparative Example 2 | Example 1 | Comparative Example 2 |
| 0.400 | 80 | 88 | 0 | 6 |
| 0.450 | 87 | 93 | 0 | 70 |
| 0.500 | 91 | 96 | 3 | 99 |
| 0.550 | 94 | 98 | 34 | 100 |
| 0.600 | 97 | 101 | 88 | 100 |
| 0.650 | 99 | 102 | 100 | 100 |

The results of these experiments indicate that the inclusion of the cellulose acetate butyrate underlayer in the donor element of Example 1 led to fewer imaging defects at comparable line widths as compared to a similar donor element without the underlayer.

Example 4

A 5 mil thick (about 130 microns) cellulose acetate butyrate substrate was coated with polystyrene to produce a 2.5 micron underlayer on the substrate. Next, the LTHC layer of Example 1 was coated onto the underlayer. The LTHC layer was cured as described in Example 1, and had about the same thickness and optical density. Next, the interlayer of Example 1 was coated and cured onto the LTHC layer in the manner described in Example 1. Finally, the blue transfer layer of Example 1 was coated onto the interlayer and left uncured.

The resultant donor element included the following layers in order: a substrate, an underlayer, an LTHC layer, an interlayer, and a transfer layer.

Example 5 (Comparative)

A donor element was made according to Example 4, except that the underlayer material was not coated onto the cellulose acetate butyrate substrate. The resultant donor element included, in order, a substrate, an LTHC layer, an interlayer, and a transfer layer. The thicknesses and compositions of the substrate, LTHC layer, interlayer, and transfer layer were the same as for the corresponding layers of the donor element prepared in Example 4.

Example 6

The donor elements made according to Example 4 and Comparative Example 5 were imaged as a function of dose onto separate 1.1 mm thick glass receptors. The transferred lines were then analyzed for line width as described in Example 3. The results of these analyses are provided in Table 5.

TABLE 5

Imaging Performance of Donor Elements Made According to Example 4 and Comparative Example 5

| | Average Line Width ($\mu$m) | |
|---|---|---|
| Imaging Dose (joules/cm$^2$) | Example 4 | Comparative Example 5 |
| 0.400 | 91 | 79 |
| 0.450 | 95 | 86 |
| 0.500 | 98 | 90 |
| 0.550 | 100 | 94 |
| 0.600 | 102 | 96 |
| 0.650 | 103 | 98 |

The results of these experiments indicate that the inclusion of the polystyrene underlayer in the donor element of Example 4 enabled the imaging of wider lines at lower imaging doses relative to Comparative Example 5 without an underlayer.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A thermal mass transfer donor element comprising:

a substrate;

a transfer layer;

a light-to-heat conversion layer disposed between the transfer layer and the substrate to generate heat when exposed to imaging radiation into heat, the heat so generated being used to thermally transfer portions of the transfer layer; and an underlayer disposed between the substrate and the light-to-heat conversion layer to manage heat flow between layers of the donor element or reduce imaging defects during imaging, the underlayer having an anisotropic thermal conductivity.

2. The donor element of claim 1, further comprising an interlayer disposed between the light-to-heat conversion layer and the transfer layer.

3. The donor element of claim 1, wherein the underlayer has a higher thermal conductivity than the substrate.

4. The donor element of claim 1, wherein the underlayer has a lower thermal conductivity than the substrate.

5. The donor element of claim 1, wherein the underlayer has a lower (specific heat×density) than the substrate.

6. The donor element of claim 1, wherein the underlayer has a higher (specific heat×density) than the substrate.

7. The donor element of claim 1, wherein the underlayer comprises an inorganic material.

8. The donor element of claim 1, wherein the underlayer comprises an organic material.

9. A method of patterning comprising the steps of:

placing a thermal transfer donor element proximate a receptor substrate, the donor element comprising a substrate, a transfer layer, a light-to-heat conversion layer disposed between the substrate and the transfer layer, and an underlayer disposed between the substrate and the light-to-heat conversion layer, the underlayer having an anisotropic thermal conductivity;

imagewise transferring the transfer layer to the receptor by selectively exposing the donor element to imaging radiation.

10. The method of claim 9, wherein the donor element further comprises an interlayer disposed between the light-to-heat conversion layer and the transfer layer.

11. The method of claim 9, wherein the underlayer has a higher thermal conductivity than the substrate.

12. The method of claim 9, wherein the underlayer has a lower thermal conductivity than the substrate.

13. The method of claim 9, wherein the underlayer has a lower (specific heat×density) than the substrate.

14. The method of claim 9, wherein the underlayer has a higher (specific heat×density) than the substrate.

15. The method of claim 9, wherein the underlayer comprises an inorganic material.

16. The method of claim 9, wherein the underlayer comprises an organic material.

* * * * *

UNITED STATES PATENT AND TRADEMARK OFFICE

CERTIFICATE OF CORRECTION

PATENT NO. : 6,284,425 B1
DATED : September 4, 2001
INVENTOR(S) : Staral, John S.

It is certified that error appears in the above-identified patent and that said Letters Patent is hereby corrected as shown below:

Column 13,
Line 67, delete "1600" and insert in place thereof -- 1600 --.

Column 14,
Line 23, delete "1600" and insert in place thereof -- 1600 --.
Line 37, delete "Pigment" and insert in place thereof -- (Pigment --.
Line 39, delete "Vioiet" and insert in place thereof -- Violet --.
Line 40, delete "Pigment" and insert in place thereof -- (Pigment --.

Signed and Sealed this

Seventh Day of May, 2002

*Attest:*

JAMES E. ROGAN

*Attesting Officer*

*Director of the United States Patent and Trademark Office*